(12) United States Patent
Nishimiya

(10) Patent No.: US 7,269,672 B2
(45) Date of Patent: *Sep. 11, 2007

(54) BUS SYSTEM DESIGN METHOD, BUS SYSTEM, AND DEVICE UNIT

(75) Inventor: Ryohei Nishimiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 295 days.

This patent is subject to a terminal disclaimer.

(21) Appl. No.: 10/777,707

(22) Filed: Feb. 13, 2004

(65) Prior Publication Data

US 2005/0044282 A1 Feb. 24, 2005

(30) Foreign Application Priority Data

Aug. 19, 2003 (JP) .............................. 2003-294845

(51) Int. Cl.
*G06F 3/00* (2006.01)
*G06F 5/00* (2006.01)

(52) U.S. Cl. ................. 710/58; 710/301; 710/302; 710/303; 710/304; 713/501; 713/502; 713/503; 713/600

(58) Field of Classification Search .......... 710/58, 710/301–304; 713/500–503, 600
See application file for complete search history.

(56) References Cited

U.S. PATENT DOCUMENTS 5,787,261 A * 7/1998 Osaka et al. ............... 710/302

| | | | |
|---|---|---|---|
| 6,078,980 A | 6/2000 | Holland et al. ............ | 710/129 |
| 6,519,669 B1 | 2/2003 | Yanagisawa | |

FOREIGN PATENT DOCUMENTS

| JP | 61-196353 | 8/1986 |
|---|---|---|
| JP | 3-259315 | 11/1991 |
| JP | 4-186411 | 7/1992 |
| JP | 7-98675 | 4/1995 |
| JP | 7-253834 | 10/1995 |
| JP | 11-232211 | 8/1999 |
| JP | 2000-122760 | 4/2000 |
| JP | 2000-298640 | 10/2000 |
| JP | 2002-140288 | 5/2002 |
| JP | 2002-244994 | 8/2002 |

* cited by examiner

*Primary Examiner*—Donald Sparks
*Assistant Examiner*—Chun-Kuan (Mike) Lee
(74) *Attorney, Agent, or Firm*—Staas & Halsey LLP

(57) ABSTRACT

A design method for a bus system comprising a noise propagation computation step and a connection timing computation step. Based on the cycle of a timing signal, a signal propagation delay in a device unit, signal propagation delays in a timing-signal bus and a data bus, and a setup time in the device unit or device connected on the data bus, the noise propagation computation step computes timing at which, when the device unit is connected on the data bus being active, noise propagates to other device units other than the connected device unit or to the device connected on the data bus. Based on the timing computed in the noise propagation computation step, the connection timing computation step computes connection timing at which the device unit is connected on the data bus.

7 Claims, 3 Drawing Sheets

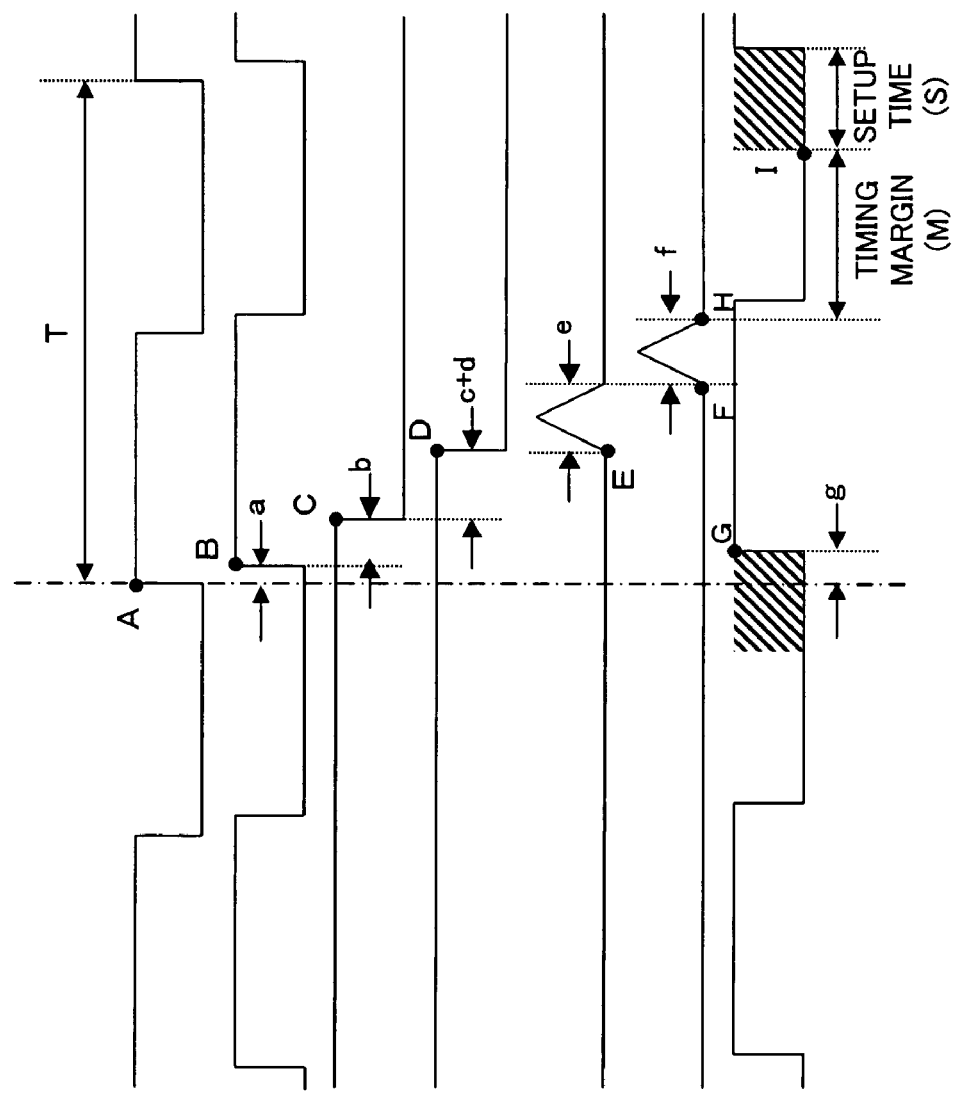

BUS SYSTEM DESIGN METHOD, BUS SYSTEM, AND DEVICE UNIT

BACKGROUND OF THE INVENTION (1) Field of the Invention

The present invention relates to a bus system in which a plurality of device units are connectible on the same bus, like a peripheral component interconnect (PCI) bus system employed in a storage system. The invention also relates to a bus system design method suitable for designing that bus system, and a device unit connectible to that bus system being in an active state.

(2) Description of Related Art

For example, a storage system is equipped with a plurality of disk units (magnetic disk units, physical device units), and is used for writing the data from a server (host) to these disk units in response to access from the server, or reading out the data requested by the server from the disk units and transmitting that data. Such a storage system includes a host interface module, which transmits data to the server through a fiber channel interface bus.

The host interface module is connected to a PCI bridge module through an interface bus such as a PCI bus and transmits data to a disk interface module, management module, etc., connected to the PCI module through the PCI bus.

The host interface module is also constructed as a single unit by mounting a central processing unit (CPU), memory, and other devices on a printed-circuit board (PCB). If the thus-constructed host interface module is fitted or inserted in a mother board having a PCI bus, the devices constituting the host interface module are communicably connected on the PCI bus. In this way, a storage system with the required number of host interface modules can be easily constructed.

If the host interface module is connected on the PCI bus of the mother board being active (active insertion), noise occurs on the PCI bus because of that active connection and has an adverse influence on the operation of other host interface modules connected on the PCI bus and operation of various devices constituting the mother board.

To prevent the adverse influence due to active insertion of host interface modules, operation of the PCI bus is generally stopped. For example, Japanese Laid-Open Patent Publication No. HEI 7-253834 discloses a module insertion control device that controls noise propagation by connecting or disconnecting some of switches during active connection and disconnection, to prevent modules from failing or operating incorrectly.

However, if the bus operation of the PCI bus is stopped in order to insert host interface modules, data transmission through the PCI bus cannot be performed during the stoppage and therefore the data transmission efficiency is reduced. Also, since a variety of operations for monitoring whether or not host interface modules are inserted in the PCI bus and stopping the PCI bus are needed, system control is frequently performed and system design efficiency is reduced.

Furthermore, a dedicated control device for active insertion (active connection) adds to manufacturing costs and results in an increase in device size.

SUMMARY OF THE INVENTION

The present invention has been made in view of the circumstances mentioned above. Accordingly, it is the object of the present invention to provide a bus system, device unit, and design method for that bus system in which the noise caused by the active connection of the device unit has no influence on other device units and devices connected on the same bus.

To achieve this end, there is provided a design method for a bus system equipped with a plurality of device units, a data bus on which the device units are connectible, a timing-signal supply source for supplying a timing signal to the device units through a timing-signal bus, a bus switch for connecting and disconnecting a signal between the device unit and the data bus, and a bus-switch control part for controlling the connecting and disconnecting operations of the bus switch. The design method of the present invention comprises (1) a noise propagation computation step of computing, based on a cycle of the timing signal, a signal propagation delay in the device unit, signal propagation delays in the timing-signal bus and the data bus, and a setup time in the device unit or device connected on the data bus, timing at which, when the device unit is connected on the data bus being active, noise propagates to the remaining device units other than the connected device unit or to the device connected on the data bus, and (2) a connection timing computation step of computing, based on the timing computed in the noise propagation computation step, connection timing at which the device unit is connected on the data bus.

In the aforementioned connection timing computation step, the connection timing may be computed by computing a delay time "b" needed for the bus switch to connect the device unit on the data bus after the device unit is connected on the timing-signal bus.

In the aforementioned noise propagation computation step, a timing margin $M\{=(T+g)-(a+b+c+d+e+f)-S\}$ between arrival of the noise at the device units other than the connected device unit or device connected to the data bus and start of the setup time may be computed as propagation timing of the noise, based on the cycle "T" of the timing signal, skew "a" from the timing-signal supply source to the bus switch control part, delay time "b" of the bus switch, signal propagation delay time "c" between the bus switch control part and the bus switch, operating delay time "d" of the bus switch, pulse width (time) "e" of the noise, propagation delay time "f" of the noise in the connected device unit and the data bus, skew "g" from the timing-signal supply source to the device units other than the connected device unit or device connected on the data bus, and setup time "S" in the bus system. In the aforementioned connection timing computation step, the delay time "b" of the bus switch may be computed so that the timing margin M is 0 or greater.

In accordance with the present invention, there is provided a bus system comprising (1) a plurality of device units, (2) a data bus on which the device units are connectible, (3) a timing-signal supply source for supplying a timing signal to the device units through a timing-signal bus, (4) a bus switch for connecting and disconnecting a signal between the device unit and the data bus, and (5) a bus-switch control part for controlling the connecting and disconnecting operations of the bus switch. The aforementioned bus-switch control part controls the bus switch so that the device unit is connected on the data bus after a delay time "b" of the bus switch from connection of the device unit on the timing-signal bus. Based on the cycle "T" of the timing signal, skew "a" from the timing-signal supply source to the bus switch control part, delay time "b" of the bus switch, signal propagation delay time "c" between the bus switch control part and the bus switch, operating delay time "d" of the bus switch, pulse width (time) "e" of noise caused when the device unit is connected on the data bus being active, propagation delay time "f" of the noise in the device unit and the data bus, skew "g" from the timing-signal supply source to the device units other than the connected device unit or device connected on the data bus, and setup time "S" in the bus system, the delay time "b" of the bus switch is computed as a value such that a timing margin M{=(T+g)−(a+b+c+d+e+f)−S} from arrival of the noise at the device units other than the connected device unit or the device to start of the setup time is 0 or greater.

In accordance with the present invention, there is provided a device unit connectible to a printed-circuit board equipped with a data bus, a timing-signal supply source, and a timing-signal bus connected to the timing-signal supply source. The device unit of the present invention comprises a bus switch for connecting and disconnecting a signal between the device unit and the data bus, and a bus-switch control part for controlling the connecting and disconnecting operations of the bus switch. The aforementioned bus-switch control part controls the bus switch so that the device unit is connected on the data bus after a delay time "b" of the bus switch from connection of the device unit on the timing-signal bus. Based on the cycle "T" of the timing signal, skew "a" from the timing-signal supply source to the bus switch control part, delay time "b" of the bus switch, signal propagation delay time "c" between the bus switch control part and the bus switch, operating delay time "d" of the bus switch, pulse width (time) "e" of noise caused when the device unit is connected on the data bus being active, propagation delay time "f" of the noise in the device unit and the data bus, skew "g" from the timing-signal supply source to device units other than the connected device unit or device connected on the data bus, and setup time "S" in the bus system, the delay time "b" of the bus switch is computed as a value such that a timing margin M{=(T+g)−(a+b+c+d+e+f)−S} from arrival of the noise at the device units other than the connected device unit or the device to start of the setup time is 0 or greater.

The bus system design method, bus system, and device unit of the present invention has the following effects and advantages:

(1) Even when data communications is being performed through a data bus, device units can be connected or disconnected. Thus, the bus system, in addition to being able to enhance system reliability, is very convenient for use.

(2) Since there is no possibility that noise, caused by connecting a device unit on a data bus being active, will have an adverse influence on other device units connected on this data bus or devices connected on the data bus, device units can be connected on the data bus being active, without stopping the transmission of data through the data bus. Thus, in addition to being able to enhance data transmission efficiency, there is no need to monitor whether or not a device unit is inserted in the data bus, and there is no need to perform a variety of controls for stopping the PCI bus. Therefore, system controls can be simplified and development and operating costs can be reduced.

(3) If the connection timing between the device unit and the data bus is computed by computing a delay time "b" needed for the bus switch to connect the device unit on the data bus after the connection between the device unit and the timing signal, the connection timing between the device unit and data bus can be easily determined.

(4) Based on the cycle "T" of the timing signal, skew "a" from the timing-signal supply source to the bus switch control part, delay time "b" of the bus switch, signal propagation delay time "c" between the bus switch control part and the bus switch, operating delay time "d" of the bus switch, pulse width (time) "e" of noise caused when the device unit is connected on the data bus being active, propagation delay time "f" of the noise in the device unit and the data bus, skew "g" from the timing-signal supply source to device units other than the connected device unit or device connected on the data bus, and setup time "S" in the bus system, the delay time "b" of the bus switch is computed so that the timing margin M{=(T+g)−(a+b+c+d+e+f)−S} from arrival of the noise at other device units or device connected on the data bus to start of the setup time is 0 or greater. Therefore, the connection timing between the device unit and the data bus can be easily determined.

BRIEF DESCRIPTION OF THE DRAWINGS

The present invention will be described in further detail with reference to the accompanying drawings wherein:

FIGS. 3A to 3G are timing diagrams in connecting device units to the PCI bus system being active.

DETAILED DESCRIPTION OF THE PREFERRED EMBODIMENT

A preferred embodiment of the present invention will hereinafter be described in detail with reference to the drawings.

A bus system as a preferred embodiment of the present invention is, for example, a PCI bus system with a PCI bus employed in a storage system, etc. The storage system is equipped with a plurality of disk units (magnetic disk units, physical device units) and writes the data from a server (host) to these disk units in response to access from the server and reads out the data requested by the server from the disk units and transmit that data. The PCI bus system is used for transmitting and receiving data signals.

The above-described storage system is equipped with a host interface module, which transmits data to a server through a fiber channel interface bus. This host interface module is connected to a PCI bridge module through an interface bus such as a PCI bus and is used to transmit data to a disk interface module, management module, etc., connected to the PCI module through the PCI bus.

The host interface module is constructed as a single unit by mounting a central processing unit (CPU), memory, and other devices on a printed-circuit board (PCB). The host interface module thus constructed as a single unit is detachably inserted in a mother board having a PCI bus, whereby the devices constituting the host interface module are communicably connected on the PCI bus. In this way, storage systems are constructed to meet desired specification.

As a bus system constructed as a preferred embodiment of the present invention, a description will be given of a PCI bus system in which a plurality of device units such as host interface modules can be fitted.

Figure 1:
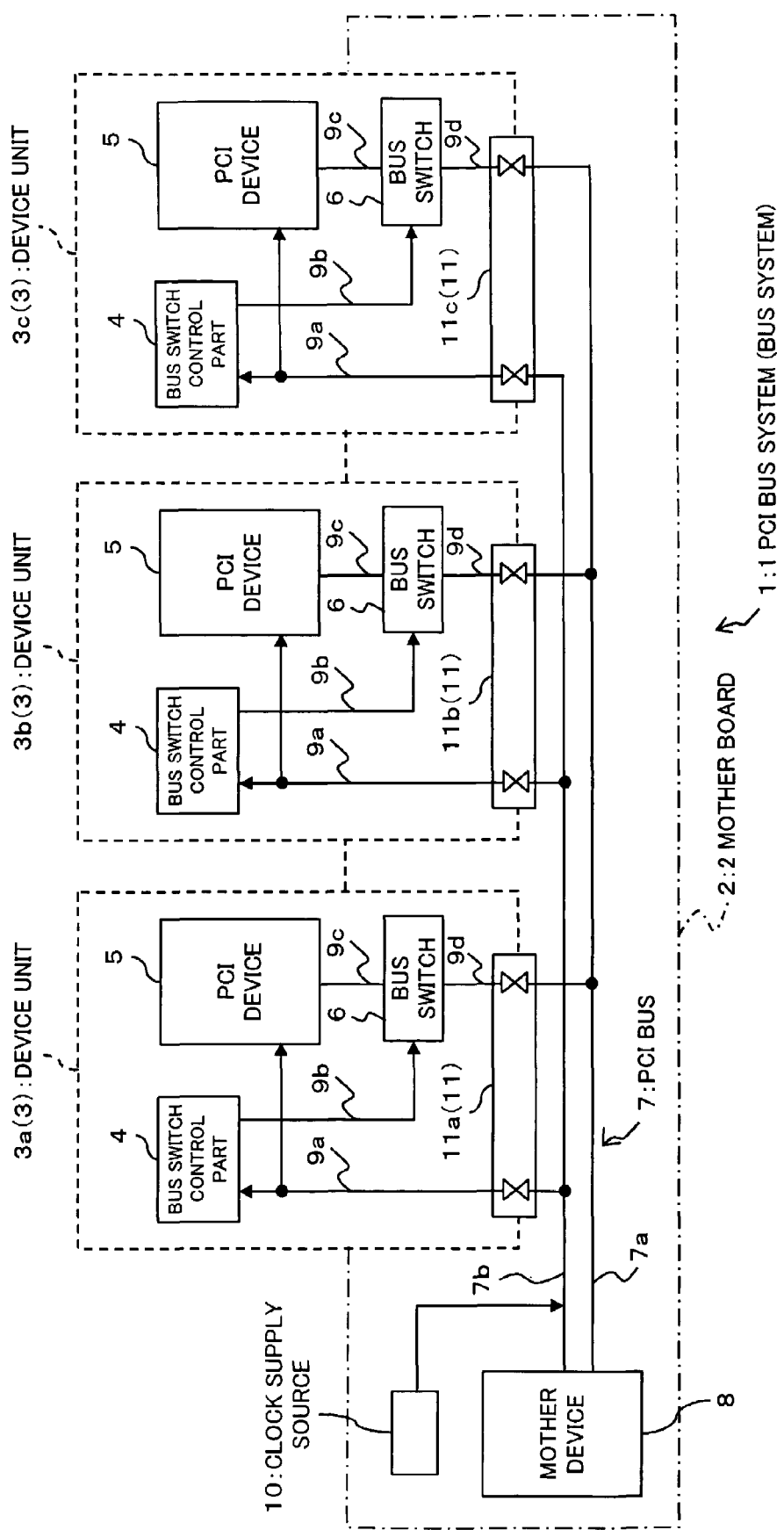
FIG. 1 is a block diagram showing a bus system (PCI bus system) constructed in accordance with a preferred embodiment of the present invention.
Figure 2:
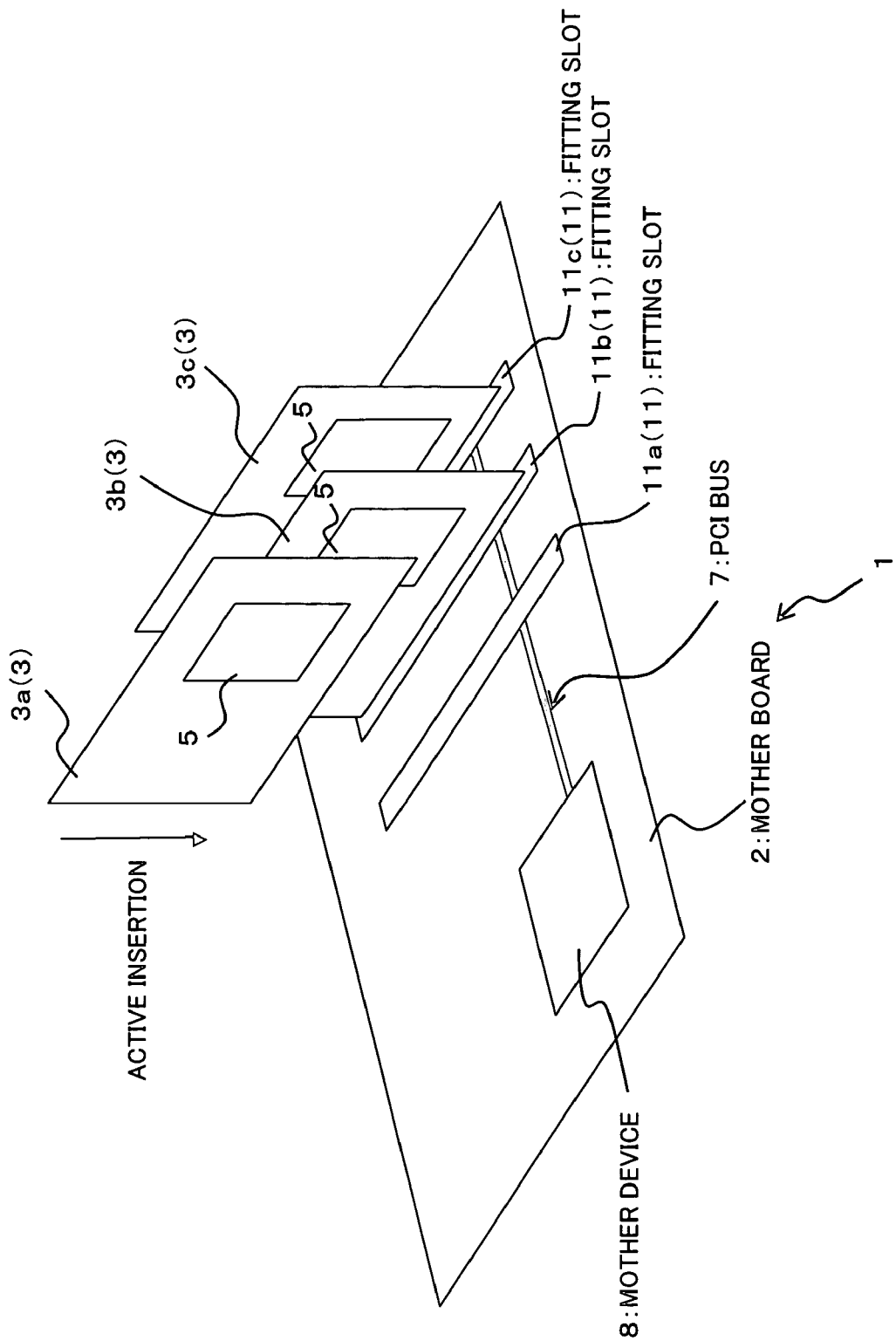
FIG. 2 is a perspective view showing the PCI bus system.

Referring to FIGS. 1 and 2, there is shown a PCI bus system 1 constructed in accordance with a preferred embodiment of the present invention. The PCI bus system 1 is equipped with a mother board 2 and a plurality of device units (e.g., three device units 3a, 3b, and 3c in FIGS. 1 and 2). These device units 3a, 3b, and 3c are constructed so that they are detachably fitted in fitting slots 11a, 11b, and 11c formed in the mother board 2. If the device units 3a, 3b, and 3c are fitted in the fitting slots 11a, 11b, and 11c, they are communicably connected on the PCI bus 7 of the mother board 2. The device units 3a, 3b, and 3c can also be connected to or disconnected from the mother board 2 even when it is in an active state.

Note that active insertion or active connection used herein is intended to mean that the device units 3a, 3b, and 3c are fitted in the mother board 2 that is active. Also, although FIG. 2 shows the three fitting slots 11, the present invention is not limited to the number. For example, the mother board 2 may contain two or less fitting slots, or four or more fitting slots. Each device unit 3 may be fitted in any of the fitting slots 11.

In addition to the fitting slots 11a, 11b, and 11c and PCI bus 7, the mother board (bus unit) 2 has a mother device 8 and a clock supply source 10 on the printed-circuit board. The PCI bus 7 consists of a data bus 7a and a clock bus (timing signal bus) 7b. The clock supply source (timing-signal supply source) 10 is used for supplying a clock signal (timing signal) through the clock bus 7b to the device units 3 fitted in the PCI bus system 1.

The mother device 8 performs various processes related to the transmission and reception of data signals through the PCI bus 7. This mother device 8 is communicably connected on the data bus 7a and clock bus 7b so it can receive the clock signal supplied from the clock supply source 10.

The data bus 7a is a data bus for the mother device 8 and device units 3a, 3b, and 3c to transmit and receive data signals between them. The clock bus 7b is a bus for connecting the clock supply source 10 with the device units 3 and mother device 8, and supplies the clock signal from the clock supply source 10, to the device units 3a, 3b, and 3c through the fitting slots 11a, 11b, and 11c. Both the data bus 7a and the clock bus 7b have the fitting slots 11a, 11b, and 11c formed along the ways so they are connected with the device units 3a, 3b, and 3c through the fitting slots 11a, 11b, and 11c.

The fitting slots 11a, 11b, and 11c are used for fitting (or inserting) the device units 3a, 3b, and 3c in the mother board 2 and are constructed of connectors, etc. With the device units 3a, 3b, and 3c fitted in the mother board 2, the clock bus 7b of the mother board 2 is connected with the buses 9a of the device units 3a, 3b, and 3c, and the data bus 7a of the mother board 2 is communicably connected with the buses 9b of the device units 3a, 3b, and 3c. Note that these fitting slots 11a, 11b, and 11c have approximately the same structure. Therefore, reference numerals 11a, 11b, and 11c are employed when one of the fitting slots needs to be specified, and reference numeral 11 represents an arbitrary fitting slot.

The device units 3a, 3b, and 3c are the host interface modules in a storage system, as previously mentioned. They are constructed by deploying a bus switch control part 4, a bus switch 6, a PCI device 5, and buses 9a, 9b, 9c, and 9d on a printed-circuit board and can be detachably fitted in the fitting slots 11a, 11b, and 11c formed in the mother board 2.

The above-described device units 3a, 3b, and 3c are nearly the same in construction. For that reason, reference numerals 3a, 3b, and 3c are employed when one of the device units needs to be specified, and reference numeral 3 denotes an arbitrary device unit.

In the preferred embodiment, the device unit 3a is fitted in the fitting slot 11a, the device unit 3b is fitted in the fitting slot 11b, and the device unit 3c is fitted in the fitting slot 11c. In the preferred embodiment, the device units 3a, 3b, and 3c are much the same in construction, so the device unit to be fitted in the fitting slot 11a can be specified as the device unit 3a. Likewise, the devices units that are to be fitted in the fitting slots 11b and 11c can be specified as the device units 3b and 3c, respectively.

Note that in the case where the device units 3 are the host interface modules in a storage system, each device unit 3, in addition to the above-described switch control part 4, PCI device 5, bus switch 6, and buses 9a, 9b, 9c, and 9d, includes memory, a CPU, and a fiber channel interface. However, in FIG. 1, the memory, CPU, and fiber channel interface are not shown for convenience, and each device unit 3 is shown so it contains only the switch control part 4, PCI device 5, bus switch 6, and buses 9a, 9b, 9c, and 9d, related to the transmission and reception of data signals through the PCI bus 7.

In the device unit 3, the bus switch control part 4 and the bus switch 6 are communicably connected through the second bus 9b. The PCI device 5 and the bus switch 6 are communicably connected through the third bus 9c. Also, in the device unit 3, the first bus 9a is formed so that when the device unit 3 is fitted in the mother board 2 through the fitting slot 11, the bus switch control part 4 and PCI device 5 are communicably connected on the clock bus 7b formed in the mother board 2. Similarly, the fourth bus 9d is formed so that when the device unit 3 is fitted in the mother board 2 through the fitting slot 11, the bus switch 6 is communicably connected on the data bus 7a.

The PCI device 5 performs various processes related to the transmission and reception of data signals to and from the mother board 2 and other device units 3 through the PCI bus 7 (data bus 7a). A clock signal from the clock supply part 10 is input to the PCI device 5 through the clock bus 7b and fitting slot 11. The PCI device 5 operates in response to that clock signal, and sends and receives data signals on and from the data bus 7a through the bus 9c, bus switch 6, bus 9d, and fitting slot 11.

The bus switch 6 is mounted between the PCI device 5 and the data bus 7a (fitting slot 11), and connects or disconnects a data signal between the PCI device 5 and the data bus 7a by connecting or disconnecting the third bus 9c and the fourth bus 9d. This bus switch 6 also performs the connecting operation or disconnecting operation in response to a connection signal or disconnection signal from the bus switch control part 4.

The bus switch control part 4 is used for controlling the connecting and disconnecting operations of the bus switch 6. This bus switch control part 4 receives a clock signal, supplied through the clock bus 7b and fitting slot 11 from the clock supply part 10, through the bus 9a and is operable based on that clock signal. And the bus switch control part 4 is able to connect the PCI device 5 on the data bus 7a at arbitrary timing by controlling the timing at which the bus switch 6 is connected. More specifically, the bus switch control part 4 controls the bus switch 6 so that the device unit 3 (PCI device 5) is connected on the data bus 7a after a previously set time "b" (delay time "b" described later) elapses from the connection of the device unit 3 (bus switch control part 4) with the clock bus 7b.

If the device unit 3 constructed as described above is inserted in the fitting slot 11 formed in the mother board 2, as shown in FIG. 2, one end of the first bus 9a in the device unit 3 is communicably connected on the clock bus 7b formed in the mother board 2, and one end of the fourth bus 9d in the device unit 3 is communicably connected on the data bus 7a formed in the mother board 2. In the example shown in FIG. 2, for convenience, only the PCI device 5 is shown in each device unit 3 and the bus switch control part 4, bus switch 6, and other components are omitted.

Next, a description will be given of the computation of the delay time "b" needed for the bus switch control part 4 to control the connecting operation of the bus switch 6 (bus system design method). FIGS. 3A to 3G are timing diagrams in connecting device units to the PCI bus system 1 being in an active state. FIG. 3A shows a clock signal (base clock) output by the clock supply source 10, FIG. 3B shows the clock signal input to the bus switch control part 4, and FIG. 3C shows a connection instruction signal output from the bus switch control part 4 to the bus switch 6. FIG. 3D shows the state in which the bus switch 6 is enabled, FIG. 3E shows noise caused in the device unit 3, FIG. 3F shows noise propagation to other device units, and FIG. 3G shows the clock signal input to other device units.

In FIGS. 3A to 3G, consider the case where in the PCI bus system 1 of FIG. 1, the device unit 3(3a) is fitted in the fitting slot 11a of the mother board 2 that is in an active state.

As shown in FIGS. 3A to 3G, based on the clock cycle "T" of the clock supply source 10, signal propagation delay in the device unit 3, signal propagation delay in the PCI bus 7 (clock bus 7a and data bus 7b), and setup time in the device unit 3 or other devices (e.g., mother board 2 or other devices), the bus system design method of the present invention computes the timing at which the noise, caused when the device unit 3a is connected on the data bus 7a being active, propagates to the device units 3b and 3 other than the device unit 3a or to a device (mother device 8, etc.) connected on the data bus 7a (noise computation step).

For instance, if the device unit 3a is inserted in the mother board 2, the first bus 9a of the device unit 3a is connected on the clock bus 7b, and the fourth bus 9d of the device unit 3a is connected on the data bus 7a. Thereafter, if a clock signal is output from the clock supply source 10 (see point A of FIG. 3A), that clock signal arrives at the bus switch control part 4 through the clock bus 7a and bus 9a after a delay of time "a" (see point B of FIG. 3B). The time "a" is the clock skew (skew) "a" from the clock supply source 10 to the bus switch control part 4.

The bus switch control part 4 outputs a connection instruction signal to the bus switch 6 after the delay time "b" elapses from the input of the clock signal (see point C of FIG. 3C). Because of a propagation delay caused by the bus 9b, it takes time "c" (signal propagation delay time "c") for the connection instruction signal to arrive at the bus switch 6, and it further takes operating delay time "d" for the bus switch 6 to connect the bus 9c and the bus 9d together after reception of the connection instruction signal (see point D of FIG. 3D).

If the bus switch 6 connects the bus 9c and the bus 9d, noise with a predetermined pulse width of "e" occurs in the device unit 3a (see point E of FIG. 3E). In this embodiment, the time "e" during which the noise occurs is referred to as the pulse width of the noise.

The noise from the device unit 3a arrives at other device units 3b and 3c after a delay of noise propagation time "f" caused by the bus 9d and data bus 7a (see point F of FIG. 3F).

On the other hand, until the clock signal supplied from the clock supply source 10 reaches the device units 3b and 3c other than the device unit 3a, propagation delay time (clock skew or skew) "g" is caused by the clock bus 7b (see point G of FIG. 3G).

Note that the above-described clock skew "a," signal propagation delay time "c," noise pulse width "e," noise propagation delay time "f," and clock skew "g" are determined by the circuit design of the mother board 2 and device unit 2 and the construction (e.g., circuit length, material, chip performance, etc.) of the printed-circuit board, while the operating delay time "d" of the bus switch and the setup time "S" for the bus system 1 are determined by the specification of the device unit 3.

In the device units 3, mother device 8, etc., various devices that operate based on the timing signal (clock signal or data strobe signal) supplied from the clock supply source 10 perform each process at the leading edge or trailing edge of the clock signal. Generally, in such devices, it is necessary to settle and hold a data signal prior to a clock signal (timing signal). In general, the minimum time needed to hold a data signal is called setup time. Note that in FIG. 3G, the setup time is represented by oblique lines.

The setup time is prescribed for each semiconductor product or each bus specification, and using the leading edge or trailing edge of a timing signal as reference, it is necessary to settle a data signal before the setup time. Therefore, if the noise, which occurs in connecting the device unit 3 to the mother board 2 being in an active state, can be prevented from overlapping each of the setup times S of other device units 3b and 3c or devices connected on the PCI bus 7 where that device unit 3a is connected, problems due to the influence of that noise can be eliminated.

Hence, in the bus system design method of the present invention, the time interval between the time that the noise caused by the active connection of the device unit 3a arrives at other device units 3b and 3c or devices connected on the PCI bus 7 where that device unit 3a is connected and the time that each of the setup times S in other device units 3 or other devices connected on that PCI bus 7 ends, that is, the time from the arrival of noise at other device units 3 or devices connected on the PCI bus 7 to the start of the setup time "S" is computed as timing margin M (noise propagation computation step), and the delay time "b" is computed so that the timing margin M is 0 or greater (timing computation step). More specifically, the timing margin M is computed based on by the following Eq. (1):

$$M=(T+g)-(a+b+c+d+e+f)-S \qquad (1)$$

where "T" is the cycle of the clock signal, "a" is the clock skew from the clock supply source 10 to the bus switch control part 4, "b" is the delay time of the bus switch 6, "c" is the propagation delay time of the clock signal in the bus 9b required for the connection instruction signal to arrive at the bus switch 6 through the bus 9b, "d" is the operating delay time needed for the bus switch to connect the bus 9c and the bus 9d together after reception of the connection instruction signal, "e" is the pulse width (time) of noise, "f" is the propagation delay time in the bus 9d and data bus 7a that occurs until noise from the device unit 3a arrives at other device units 3b and 3c, "g" is the propagation delay in the clock bus 7b that occurs until the clock signal from the clock supply source 10 arrives at the device units 3b and 3c other than the device unit 3a, and is the clock skew (skew) between the connected device unit 3a and the device units 3b, 3c or other devices connected on the same data bus 7a, and "S" is the setup time for the bus system 1.

That is, the above-described parameters (the cycle "T" of the clock signal, clock skew "a" from the clock supply source 10 to the bus switch control part 4, delay time "b" of the bus switch 6, signal propagation delay time "c" between the bus switch control part 4 and the bus switch 6, operating delay time "d" of the bus switch 6, pulse width (time) "e" of noise, propagation delay time "f" of noise in the device unit 3 and data bus 7a, clock skew "g" from the clock supply source 10 to the device units 3b, 3c or other devices connected on the same data bus 7a, and setup time "S" in the PCI bus system 1) are set so that the timing margin M computed by the above-described Eq. 1 is 0 or greater.

In this embodiment, the bus switch control part 4 performs the setting of the timing margin M by adjusting and setting the time "b" (delay time "b") from the connection between the device unit 3 (bus switch control part 4) and the clock bus 7b to the connection between the device unit 3 (PCI device 5) and the data bus 7a. That is, the delay time "b" is computed as a value such that the timing margin M computed by the above-described Eq. 1 is 0 or greater.

To connect each of the device units 3 to the mother board 2 that is in an active state, it is necessary to compute each delay time "b" so that noise from each of the device units does not overlap the setup time of each of the device units.

For example, as shown in FIG. 1, to design the PCI bus system 1 in which three device units 3a, 3b, and 3c are connectible to the mother board 2 being active, it needs to be designed so that noise caused by the active connection of each of the device units 3a, 3b, and 3c does not affect the setup time for each of the device units 3a, 3b, and 3c. For that reason, it is important to design the PCI bus system 1 so that noise caused by the active insertion of the device unit 3a does not overlap the setup time for the device unit 3b and setup time for the device unit 3c, so that noise caused by the active insertion of the device unit 3b does not overlap the setup time for the device unit 3a and setup time for the device unit 3c, and so that noise caused by the active insertion of the device unit 3c does not overlap the setup time for the device unit 3a and setup time for the device unit 3b.

That is, to compute the delay time "b" meeting the above-described conditions for each of the device units 3a, 3b, and 3c, the timing margin M1 for the device unit 3a to be connected to the mother board 2 in an active state is computed based on the following Eq. (2). Next, the timing margin M2 for the device unit 3b is computed based on the following Eq. (3), and the timing margin M3 for the device unit 3c is computed based on the following Eq. (4).

$$M1=\min[\{(T+g_{12})-(a+b+c+d+e+f_{12})-S\}, \{(T+g_{13})-(a+b+c+d+e+f_{13})-S\}] \quad (2)$$

In Eqs. (2), (3), and (4), the reference characters T, a, b, c, d, e, and S are the same or approximately the same as the aforementioned reference characters. The equation min[a, b] is intended to mean that the smaller of the two (a and b) is selected. The character $g_{12}$ is the clock skew between the device unit 3a and the device unit 3b, and $g_{13}$ is the clock skew between the device unit 3a and the device unit 3c. The character $f_{12}$ is the propagation time of noise from the device unit 3a to the device unit 3b, and $f_{13}$ is the propagation time of noise from the device unit 3a to the device unit 3c.

$$M2=\min[\{(T+g_{21})-(a+b+c+d+e+f_{21})-S\}, \{(T+g_{23})-(a+b+c+d+e+f_{23})-S\}] \quad (3)$$

where $g_{21}$ is the clock skew between the device unit 3b and the device unit 3a (in this embodiment, $g_{21}$ is the same as $g_{12}$), $g_{23}$ is the clock skew between the device unit 3b and the device unit 3c, $f_{21}$ is the propagation time of noise from the device unit 3b to the device unit 3a (in this embodiment, $f_{21}$ is the same as $f_{12}$), and $f_{23}$ is the propagation time of noise from the device unit 3b to the device unit 3c.

$$M3=\min[\{(T+g_{31})-(a+b+c+d+e+f_{31})-S\}, \{(T+g_{32})-(a+b+c+d+e+f_{32})-S\}] \quad (4)$$

where $g_{31}$ is the clock skew between the device unit 3c and the device unit 3a (in this embodiment, $g_{31}$ is the same as $g_{13}$), $g_{32}$ is the clock skew between the device unit 3c and the device unit 3b (in this embodiment, $g_{32}$ is the same as $g_{23}$), $f_{31}$ is the propagation time of noise from the device unit 3c to the device unit 3a (in this embodiment, $f_{31}$ is the same as $f_{13}$), and $f_{32}$ is the propagation time of noise from the device unit 3c to the device unit 3b (in this embodiment, $f_{32}$ is the same as $f_{23}$).

After the delay time "b" is computed so each of the above-described timing margins M1, M2, and M3 is 0 or greater, setting is performed so that in each device unit 3, the bus switch control part 4 connects the device unit 3 (PCI device 5) and the data bus 7a together after a predetermined time "b" (delay time "b") elapses from the connection of the device unit 3 (bus switch control part 4) with the clock bus 7b. Such setting can be easily realized by causing the bus switch control part 4 to have a delay circuit, or designing a circuit length so that a propagation delay equivalent to the delay time "b" occurs within the bus switch control part 4.

According to the PCI bus system 1 as the preferred embodiment of the present invention, the PCI bus system 1 is designed as described above. Therefore, even when the device unit 3 is inserted in any of the fitting slots 11 in the mother board 2 being active, there is no possibility that noise caused by the active connection will have an adverse influence on other device units 3 connected on the PCI bus 7. In addition to being able to enhance the reliability of the PCI bus system 1, it is very convenient because even when data communications is being performed through the PCI bus 7, the device units 3 can be connected or disconnected without taking the influence of the noise into account.

In connecting the device units 3 to the mother board 2, the mother board 2 does not need to be made inactive (e.g., power to the mother board 2 does not need to be disconnected), so data transmission can be efficiently performed. Also, since in connecting the device units 3, control for stopping the PCI bus 7 is not needed, the system 1 can be made structurally simple and the manufacturing costs and running costs can be reduced.

As shown by Eqs. (2) to (4), the common delay time "b" for the bus switch control part 4 in each device unit 3 is set so that in each device unit, noise caused by the active insertion of the device unit 3 does not overlap the setup time of each of other device units. Therefore, individual setting does not have to be performed for each device unit 3, the manufacturing costs can be reduced, and the PCI bus system 1 is very convenient for use.

Since the device units 3 are approximately the same in construction, and the common delay time "b" for the bus switch control part 4 is set, each device unit can be fitted in any of the fitting slots 11. Thus, the PCI bus system 1 is very convenient for use.

While the present invention has been described with reference to the preferred embodiment thereof, the invention is not to be limited to the details given herein, but may be modified within the scope of the invention hereinafter claimed.

For example, in the above-described embodiment, the clock signal supplied from the clock supply source 10 is employed as a timing signal, but the present invention is not limited to the clock signal. For instance, a data strobe signal may be employed as a timing signal.

In the examples shown in FIGS. 3C and 3D, the connection instruction signal from the bus switch control part 4 is output based on the trailing edge, and the bus switch 6 is enabled based on the trailing edge. However, leading edges may be employed as reference.

The signals shown in FIGS. 3A, 3B, and 3E to 3G employ the leading edges as reference, but they may employ the trailing edges.

In the above-described embodiment, the clock supply source (timing-signal supply source) 10 is provided within the mother device 8 of the mother board 2, but there may be provided a clock bus supply source 10 outside the mother device 8. In this case a clock signal is supplied from that clock bus supply source 10 to the clock bus 7b.

In the above-described embodiment shown in FIG. 3, when designing the PCI bus system 1 in which three device units 3a, 3b, and 3c are connectible to the mother board being active, the timing margins M1, M2, and M3 are computed so that noise caused by each of the active connections of the device units 3a, 3b, and 3c has no influence on the setup time of each of the device units 3a, 3b, and 3c, and the delay time "b" is determined. However, the present invention is not limited to this embodiment. It is also important that the noise caused by the active connection of the device unit 3 should not have an adverse influence on each of the setup times for other devices connected on the PCI bus 7. That is, it is important for the noise not to overlap those setup times.

Next, consider the case where in addition to the three device units 3a, 3b, and 3c, the mother device 8 is connected on the PCI bus 7. In this case, the timing margin M1 for the active connection of the device unit 3a is computed based on the following Eq. (5) so that in the PCI bus system 1, the noise caused by each of the active connections of the device units 3a, 3b, and 3c does not have an adverse influence on the device units 3a, 3b, and 3c and on the mother device 8. Likewise, the timing margin M2' for the active connection of the device unit 3b is computed based on the following Eq. (6), and the timing margin M3' for the active connection of the device unit 3c is computed based on the following Eq. (7).

$$M1'=\min[\{(T+g_{12})-(a+b+c+d+e+f_{12})-S\}, \{(T+g_{13})-(a+b+c+d+e+f_{13})-S\}, \{(T+g_{1m})-(a+b+c+d+e+f_{1m})-S\}] \quad (5)$$

In Eqs. (5), (6), and (7), the reference characters T, a, b, c, d, e, g, f, and S are the same or approximately the same as the aforementioned reference characters. The equation min[a, b, c] is intended to mean that the smallest of the three (a, b, and c) is selected. The character $g_{1m}$ is the clock skew between the device unit 3a and the mother board 8, and $f_{1m}$ is the propagation time of noise from the device unit 3a to the mother board 8.

$$M2'=\min[\{(T+g_{21})-(a+b+c+d+e+f_{21})-S\}, \{(T+g_{23})-(a+b+c+d+e+f_{23})-S\}, \{(T+g_{2m})-(a+b+c+d+e+f_{2m})-S\}] \quad (6)$$

where $g_{2m}$ is the clock skew between the device unit 3b and the mother board 8, and $f_{2m}$ is the propagation time of noise from the device unit 3b to the mother board 8.

$$M3'=\min[\{(T+g_{31})-(a+b+c+d+e+f_{31})-S\}, \{(T+g_{32})-(a+b+c+d+e+f_{32})-S\}, \{(T+g_{3m})-(a+b+c+d+e+f_{3m})-S\}] \quad (7)$$

where $g_{3m}$ is the clock skew between the device unit 3c and the mother board 8, and $f_{3m}$ is the propagation time of noise from the device unit 3c to the mother board 8.

And the above-described parameters (the cycle "T" of the clock signal, clock skew "a" from the clock supply source 10 to the bus switch control part 4, delay time "b" of the bus switch 6, signal propagation delay time "c" between the bus switch control part 4 and the bus switch 6, operating delay time "d" of the bus switch 6, pulse width (time) "e" of noise, propagation delay time "f" of noise in the device unit 3 and data bus 7a, clock skew "g" from the clock supply source 10 to the device units 3b, 3c or other devices connected on the data bus 7a, and setup time "S" in the PCI bus system 1) are set so that each of the timing margins M1', M2', and M3' is 0 or greater.

In this way, in the PCI bus system 1 where three device units 3a, 3b, and 3c are connectible to the mother board 2 being in an active state, the noise caused by the active connections of the device units 3a, 3b, and 3c can be prevented from having an adverse influence on other device units 3a, 3b, and 3c and mother device 8.

In the above-described embodiment, the PCI bus system 1 has been shown as a bus system, but the present invention is not limited to that bus system. For example, it is also applicable to other bus systems such as an ISA (Industry Standard Architecture) bus, NuBus, etc.

In the above-described embodiment, the PCI bus system 1 has three device units 3a, 3b, and 3c, but the present invention is not limited to the three. For example, it may have two or less device units, or four or more device units. Also, these device units 3 may differ in construction from each other.

Now that the preferred embodiment of the present invention has been described, it will be apparent to those skilled in this art that the bus system design method, bus system, and device unit of the present invention can be easily carried out and manufactured.

If a bus system such as a PCI bus system is designed so that the noise caused by the active connection of a device unit has no influence on other device units and devices connected on the same bus, many active connections of device units can be realized.

What is claimed is:

1. A design method for a bus system equipped with a plurality of device units, a data bus on which said plurality of device units are connectible, a timing-signal supply source supplying a timing signal to said plurality of device units through a timing-signal bus, a bus switch connecting and disconnecting a signal between said plurality of device units and said data bus, and a bus-switch control part controlling the connecting and disconnecting operations of said bus switch, said design method comprising:

computing, for each of said plurality of device units, based on a cycle of said timing signal, a signal propagation delay in each one of said plurality of device units, signal propagation delays in said timing-signal bus and said data bus, and a setup time in one or more other of said plurality of device units or one or more other devices connected on said data bus, timing at which, when each one of said plurality of device units is connected on said data bus being active, noise propagates to the one or more other of said plurality of device units or to the one or more other devices connected on said data bus; and computing, based on said computed timing, connection timing at which each one of said plurality of device units is connected on said data bus, wherein in said computing, based on said computed timing, said connection timing is computed by computing a delay time "b" needed for said bus switch to connect each one of said plurality of device units on said data bus after each one of said plurality of device units is connected on said timing-signal bus.

2. The design method as set forth in claim 1, wherein:

in said computing, for each of said plurality of device units, a timing margin $M\{=(T+g)-(a+b+c+d+e+f)-S\}$ between arrival of said noise at the one or more other of said plurality of device units or the one or more other devices connected to said data bus and start of said setup time is computed as propagation timing of said noise, based on cycle "T" of said timing signal, skew "a" from said timing-signal supply source to said bus switch control part, delay time "b" of said bus switch, signal propagation delay time "c" between said bus switch control part and said bus switch, operating delay time "d" of said bus switch, pulse width (time) "e" of said noise, propagation delay time "f" of said noise in each one of said plurality of device units and said data bus, skew "g" from said timing-signal supply source to the one or more other of said plurality of device units or the one or more other devices connected on said data bus, and setup time "S" in said bus system, and in said computing, based on said computed timing, the delay time "b" of said bus switch is computed so that said timing margin M is 0 or greater.

3. A bus system comprising:

a plurality of device units;

a data bus on which said plurality of device units are connectible;

a timing-signal supply source supplying a timing signal to said plurality of device units through a timing-signal bus, a bus switch connecting and disconnecting a signal between said plurality of device units and said data bus; and a bus-switch control part controlling the connecting and disconnecting operations of said bus switch;

wherein said bus-switch control part controls said bus switch so that each one of said plurality of device units is connected on said data bus after a delay time "b" of said bus switch from connection of each one of said plurality of device units with said timing-signal bus, and wherein, based on cycle "T" of said timing signal, skew "a" from said timing-signal supply source to said bus switch control part, the delay time "b" of said bus switch, signal propagation delay time "c" between said bus switch control part and said bus switch, operating delay time "d" of said bus switch, pulse width (time) "e" of noise caused when each one of said plurality of device units is connected on said data bus being active, propagation delay time "f" of said noise in each one of said plurality of device units and said data bus, skew "g" from said timing-signal supply source to one or more other of said plurality of device units or one or more other devices connected on said data bus, and setup time "S" in said bus system, the delay time "b" of said bus switch is computed as a value such that a timing margin $M\ \{=(T+g)-(a+b+c+d+e+f)-S\}$ from arrival of said noise at the other of said plurality of device units or the one or more other devices to start of said setup time is 0 or greater.

4. A device unit connectible to a printed-circuit board equipped with a data bus, a timing-signal supply source, and a timing-signal bus connected to said timing-signal supply source, comprising:

a bus switch connecting and disconnecting a signal between said device unit and said data bus; and a bus-switch control part controlling the connecting and disconnecting operations of said bus switch;

wherein said bus-switch control part controls said bus switch so that said device unit is connected on said data bus after a delay time "be" of said bus switch from connection of said device unit with said timing-signal bus, and wherein, based on cycle "T" of said timing signal, skew "a" from said timing-signal supply source to said bus switch control part, the delay time "b" of said bus switch, signal propagation delay time "c" between said bus switch control part and said bus switch, operating delay time "d" of said bus switch, pulse width (time) "e" of noise caused when said device unit is connected on said data bus being active, propagation delay time "f" of said noise in said device unit and said data bus, skew "g" from said timing-signal supply source to one or more other device units other than said device unit or one or more other devices connected on said data bus, and setup time "S" in said bus system, the delay time "b" of said bus switch is computed as a value such that a timing margin $M\ \{=(T+g)-(a+b+c+d+e+f)-S\}$ from arrival of said noise at the one or more other device units or the one or more other devices to start of said setup time is 0 or greater.

5. The method of claim 1, further comprising:

computing the delay time "b" so that noise from each one of the plurality of device units does not overlap the setup time of each one of the plurality of device units.

6. The bus system of claim 3, wherein the delay time "b" is computed so that noise from each of the plurality of device units does not overlap the setup time of each of the plurality of device units.

7. The device unit of claim 4, wherein the delay time "b" is computed so that noise from each of the one or more device units does not overlap the setup time of each of the one or more device units.

* * * * *

UNITED STATES PATENT AND TRADEMARK OFFICE
CERTIFICATE OF CORRECTION

| | |
|---|---|
| PATENT NO. | : 7,269,672 B2 |
| APPLICATION NO. | : 10/777707 |
| DATED | : September 11, 2007 |
| INVENTOR(S) | : Ryohei Nishimiya |

It is certified that error appears in the above-identified patent and that said Letters Patent is hereby corrected as shown below:

Col. 14, line 17, delete ""be"" and insert --"b"--, therefor.

Signed and Sealed this

Twenty-sixth Day of February, 2008

JON W. DUDAS
*Director of the United States Patent and Trademark Office*